United States Patent [19]

Eberhardt et al.

[11] Patent Number: 5,570,065
[45] Date of Patent: Oct. 29, 1996

[54] ACTIVE BIAS FOR RADIO FREQUENCY POWER AMPLIFIER

[75] Inventors: John E. Eberhardt, Alpharetta; Enrico Bellotti, Norcross, both of Ga.

[73] Assignee: Motorola, Inc., Schaumburg, Ill.

[21] Appl. No.: 296,826

[22] Filed: Aug. 26, 1994

[51] Int. Cl.$^6$ ............................................. H23F 1/30
[52] U.S. Cl. .................... 330/296; 330/279; 330/289; 330/298
[58] Field of Search ................... 330/207 P, 129, 330/134, 278, 279, 289, 296, 298; 455/117, 127

[56] References Cited

U.S. PATENT DOCUMENTS

| | | |
|---|---|---|
| 3,729,685 | 4/1973 | Linder . |
| 3,906,386 | 9/1975 | Hongu et al. ............................ 330/289 |
| 3,997,852 | 12/1976 | Schornack et al. . |
| 4,260,956 | 4/1981 | Harford ................................... 330/289 |
| 4,302,727 | 11/1981 | Iwamatsu ............................. 330/289 X |
| 4,602,218 | 7/1986 | Vilmur et al. . |
| 4,727,337 | 2/1988 | Jason ...................................... 330/298 |
| 5,023,569 | 6/1991 | Raven . |
| 5,066,922 | 11/1991 | Leitch . |
| 5,187,395 | 2/1993 | Pirez . |
| 5,216,378 | 6/1993 | Einbinder et al. . |
| 5,239,693 | 8/1993 | Gailus et al. . |
| 5,278,997 | 1/1994 | Martin ..................................... 455/127 |

FOREIGN PATENT DOCUMENTS

184408  7/1988  Japan ..................................... 330/289

*Primary Examiner*—James B. Mullins
*Attorney, Agent, or Firm*—Kenneth M. Massaroni; Scott M. Garrett

[57] ABSTRACT

A transceiver (100) includes a radio frequency power amplifier (116) which is biased by an active bias circuit (110). Active bias circuit (110) provides a low cost bias circuit for amplifier (116) which adjusts the bias over changes in temperature and supply voltage levels to provide a constant output power. A set of control inputs (122–126) coming from controller (108) provide for power output level adjustment for the amplifier (116) in a frequency modulated (FM) environment and for both power and modulation level adjustments in an amplitude modulated (AM) environment.

8 Claims, 6 Drawing Sheets

FIG.2

FIG. 4 — BIAS vs SUPPLY at +27C

FIG.6

| PWR. ADJ WORD | A    | B    | C    | PWR OUT (dBm) |
|---------------|------|------|------|---------------|
| pwf0          | LO   | LO   | LO   | 15.92         |
| pwe0          | LO   | HI   | LO   | 15.92         |
| pwd0          | LO   | HI   | HI Z | 15.89         |
| pwc0          | HI Z | HI   | LO   | 15.88         |
| pwb0          | HI Z | HI   | HI Z | 15.54         |
| pwa0          | LO   | LO   | HI   | 14.82         |
| pw90          | LO   | HI Z | HI   | 14.24         |
| pw80          | HI   | LO   | LO   | 14.17         |
| pw70          | HI   | HI Z | LO   | 13.35         |
| pw60          | HI Z | LO   | HI   | 12.82         |
| pw50          | HI   | LO   | HI Z | 11.57         |
| pw40          | HI Z | HI Z | HI   | 11.30         |
| pw30          | HI   | HI Z | HI Z | 9.33          |
| pw20          | LO   | HI   | HI   | 7.54          |
| pw10          | HI   | HI   | LO   | 1.85          |
| pw00          | HI   | HI   | HI   | OFF           |

2

ACTIVE BIAS FOR RADIO FREQUENCY POWER AMPLIFIER

TECHNICAL FIELD

This invention relates in general to power amplifier circuits and more specifically to a radio frequency (RF) amplifier having an active bias circuit.

BACKGROUND

There has been a strong interest on the part of utility companies, and similar entities, to take advantage of modern technology to reduce costs and increase efficiency in meter reading applications. Traditionally, meters, such as electric, water, and gas meters, have been manually read by a person physically reading each meter. However, recent developments have provided for meters which can be remotely accessed from a central location through wire or wireless (e.g., radio frequency, etc.) communication links. Oftentimes, these remotely accessible meters have battery powered meter interface devices which can access the meter status information, and which can communicate via radio frequency (RF) signals the meter status information to a remotely situated meter reading device.

In a typical operational environment, a meter reading system includes a large number of meter installations. Low maintenance battery-operated meters are desirable to facilitate operating efficiency and to reduce maintenance costs. These remote meters typically become exposed to changing environmental conditions, such as extreme changes in temperature which require that the radio RF transmitter be able to operate over changes in temperature and battery voltage. Therefore, there exists a need for a low cost radio transmitter located within the meter interface which can operate effectively over changes in temperature and supply voltage variations.

DETAILED DESCRIPTION OF THE PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward.

Figure 1:
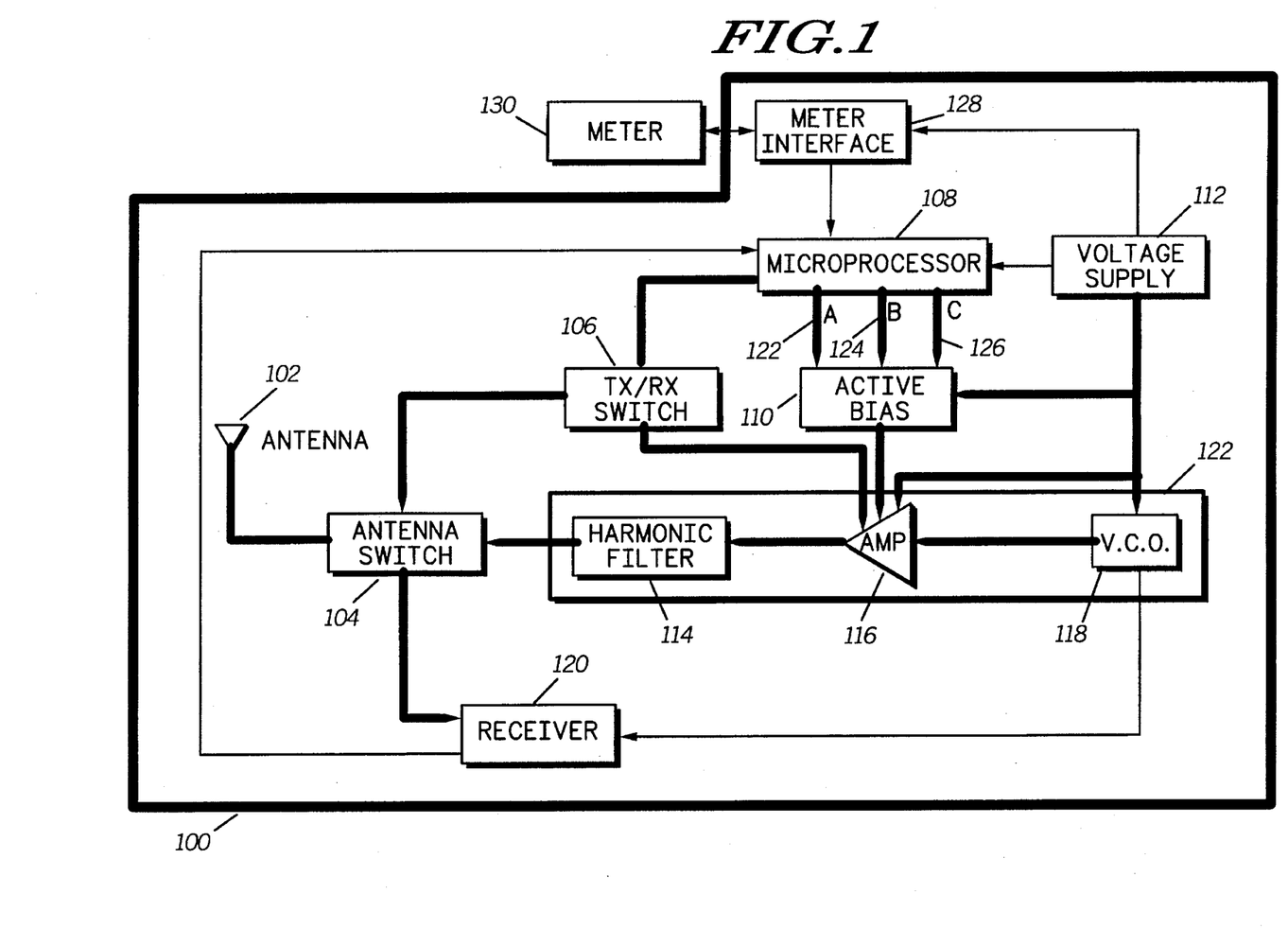
FIG. 1 is a block diagram of a meter interface unit in accordance with the invention.

Referring to FIG. 1, there is shown a schematic block diagram of a meter interface unit 100 including radio frequency transceiver in accordance with the invention. Transceiver 100 includes a controller such as a microprocessor 108 which in the preferred embodiment comprises a MC68HC05 microcontroller manufactured by Motorola, Inc. Controller 108 controls the overall operation of transceiver 100 using software stored within the controller. Controller 108 controls a transmit/receive switch 106 which controls the switching of antenna switch 104 as well as causes RF power amplifier 116 to be activated when in the transmit mode. Antenna switch 104 selectively couples either receiver section 120 or the transmitter section 122 to antenna 102.

Transmitter section 122 includes a conventional voltage controlled oscillator (VCO) 118, a radio frequency power amplifier 116 and a conventional harmonic filter 114 for filtering the transmit information prior to transmission. A voltage supply 112 provides voltage to all of the circuits in transceiver 100. Under the control of microprocessor 108 is an active bias circuit 110 which will be explained in detail later. Active bias circuit 110 controls the bias of amplifier 116 over changing temperature and supply voltage levels. An conventional receiver section 120 can be included for reception of information, such as requests from a meter reading device for meter information from meter 130. Controller 108 provides the overall control for both receiver 120 and transmitter 122. For receive operations, communication signals are received by antenna 102 and are selectively processed by receiver 120. Similarly, for transmit operations, communication signals are processed by the transmitter 122 and radiated through antenna 102.

The meter interface unit 100 provides an interface for reading a meter 130, such as an electricity meter, water meter, a gas meter, or other similar devices. Additionally, the meter interface unit 100 provides remote access to the functions of the meter 130 (e.g., amount of electricity consumption measured by the meter, etc.). A meter interface portion 128 is electrically coupled to meter 130 and provides access to the functions of meter 130. In most applications, meter interface portion 128 takes information from meter 130 and provides the meter information to controller 108 so that it can then send the meter information to meter reading devices. The design of meter interface portion 128 will depend on the type of meter 130 which will be interfaces. Typically, meter interface 128 will comprise a conventional serial digital interface which is used to acquire the digital information provided by meter 130.

Figure 2:
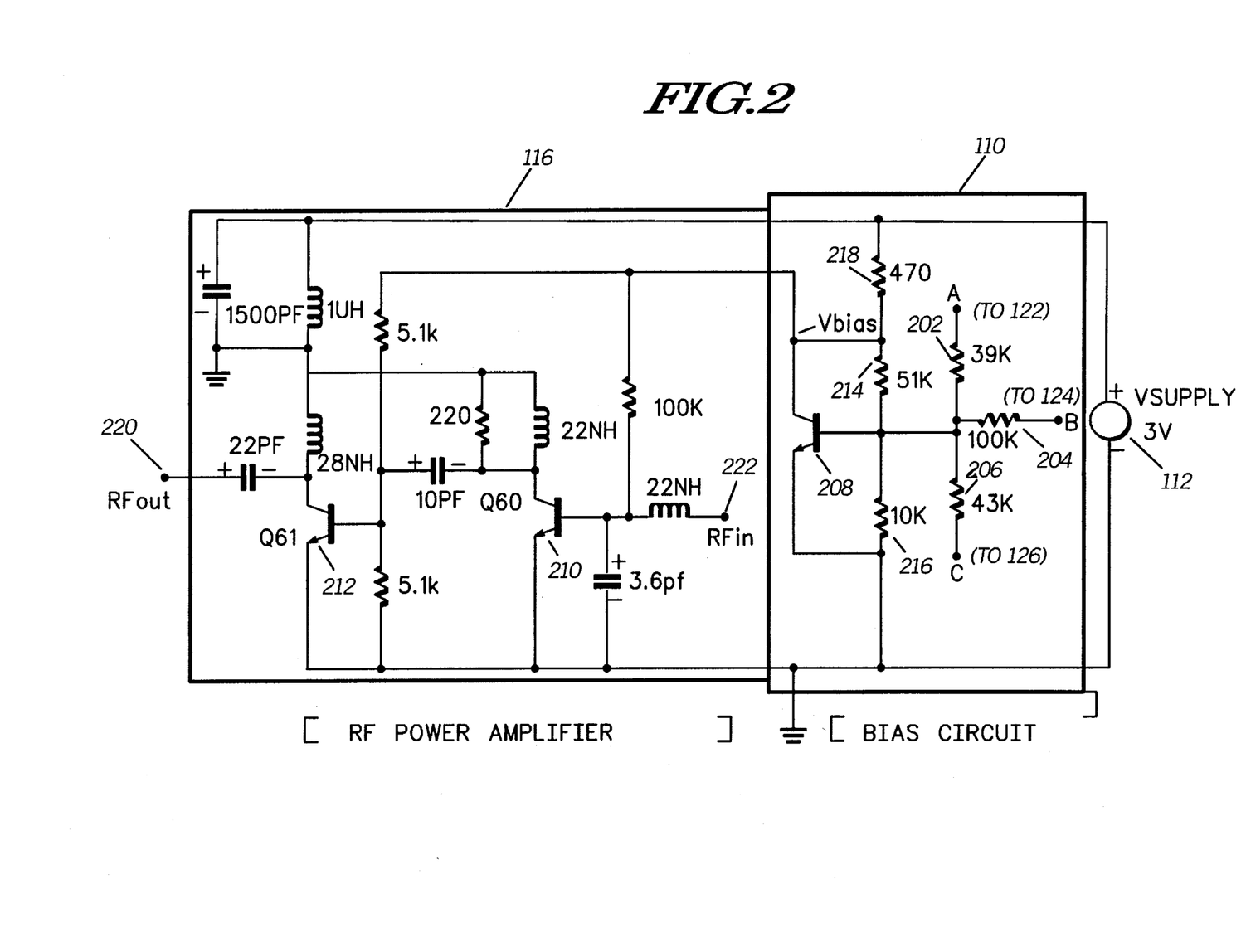
FIG. 2 is an electrical schematic of the bias and amplifier circuits shown in FIG. 1.

Referring now to FIG. 2, an electrical schematic of the RF power amplifier 116 and active bias circuit 110 of FIG. I is shown. The active bias circuit although shown outside of the transmitter portion 122 in FIG. 1 is typically part of the transmitter section. Active bias circuit 110 comprises a set of resistors 202–206 each having one end tied to a data line 122, 124 and 126 respectively. The data lines are in turn coupled to output ports of the controller 108. The other ends of resistors 202, 204 and 206 are coupled to the base of a control device such as bias transistor 208. Control resistors 202, 204, and 206 perform a digital to analog conversion (D/A) since controller 108 does in the preferred embodiment does not have on-board D/A circuits.

The active bias circuit 110 includes an adjustment means which includes resistors 202, 204 and 206 which convert a three bit digital word and convert it into an analog voltage provided to the base terminal of transistor 208. The adjustment means further includes bias transistor 208 and resistors 214, 216 and 218 which actively control the bias level for both the first stage RF amplifier transistor 210 and the second or final stage RF amplifier transistor 212. The values for resistors 214 and 216 are chosen in order to multiply the base-to-emitter voltage (Vbe) and the Vbe change of bias transistor 208 which occurs over changes in temperature. Bias transistor 208 acts as a variable resistor. When nodes A, B, and C are set to the low state or set to the high impedance state, bias transistor 208 is in cutoff and thus the collector-to-emitter resistance of bias transistor 208 is very high, essentially an open circuit. The voltage at the bias node Vbias is then at a maximum level and the power amplifier 116 is at maximum output power. When nodes A, B, and C are in the high state (at supply voltage), the voltage at the base of bias transistor 208 is sufficient to place bias transistor 208 into saturation, causing the collector-to-emitter resistance of bias transistor 208 to be very low. The voltage at bias node Vbias is then at a minimum, and the power amplifier 116 is at minimum output power output or off.

The cases in which nodes A, B, and C, are at the same potential, high state, low state, or high impedance state, represent the rails or extremes of the tuning range. For most other permutations of nodes A, B, and C, the bias transistor 208 is somewhere in it's active region and the collector-to-emitter path is acting as a variable resistor. As temperature rises, the base-to-emitter voltage (Vbe) of a bipolar transistor decreases by approximately 2 milli-volts (mV) per degree Celsius, and thus, for a set voltage at the base of bias transistor 208, an increase in temperature will cause the collector-to-emitter resistance to decrease, causing the voltage at node Vbias to drop. This is the desired effect, as the gain of power amplifier 116 increases with increasing temperature.

When the operating temperature drops, Vbe rises, the collector-to-emitter resistance increases and the voltage at node Vbias increases, which is again the desired effect, as the gain of power amplifier 116 decreases with decreasing temperature. The nominal gain of bias transistor 208 is set by resistors 214 and 216. The gain of bias transistor 208 determines the amount of temperature and voltage compensation. Bias transistor 208 is located in thermal proximity or physically close to power amplifier 116 so that bias transistor 208 and power amplifier 116 are at essentially the same temperature, regardless of any uneven heating which may occur on the circuit board. The distance between bias transistor 208 and power amplifier circuit 116 should be as close as possible so that both are operating at substantially the same temperature environment.

Figure 3:
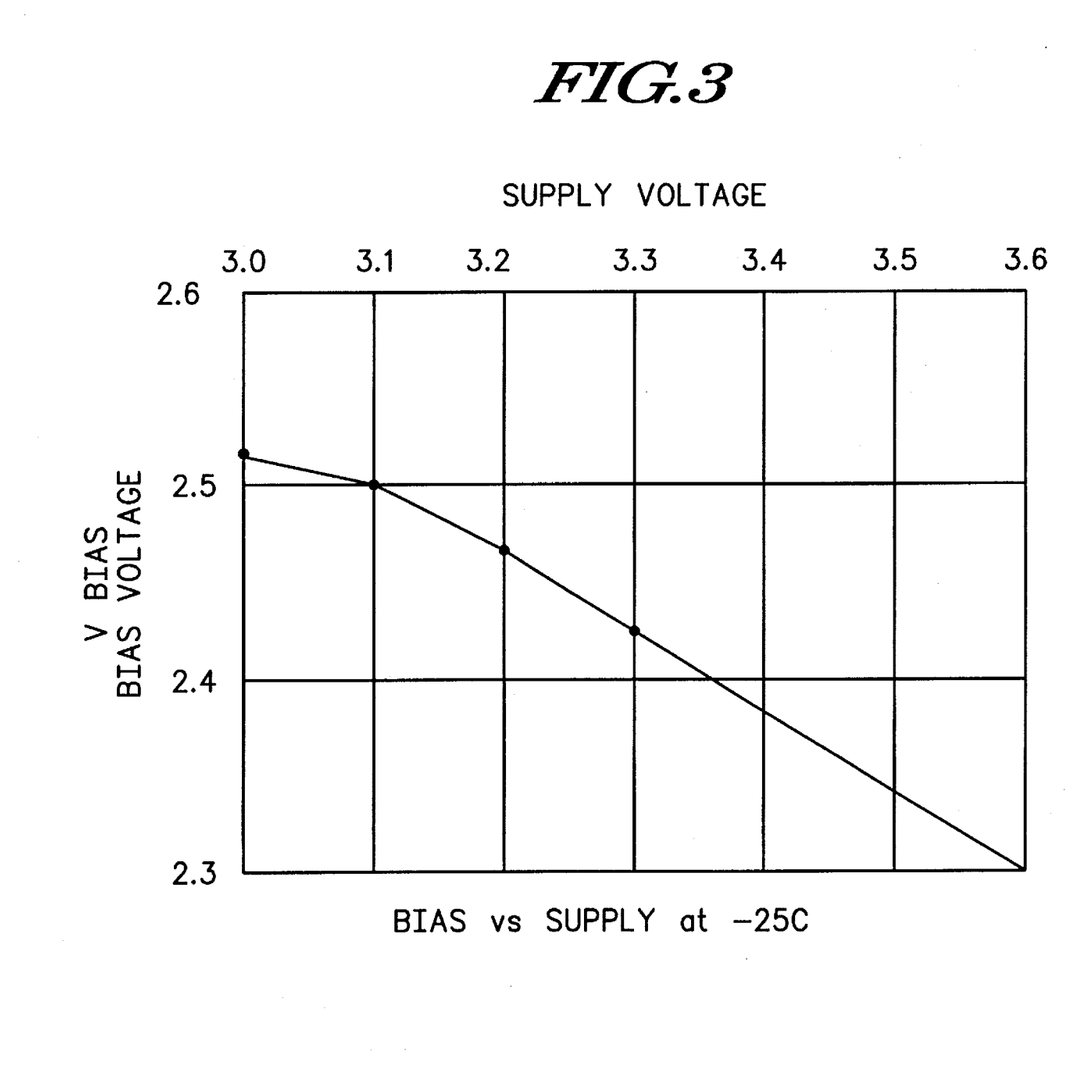
FIGS. 3–5 show graphs of bias voltage versus supply voltage at different operating temperatures for the circuit shown in FIG. 2.
Figure 4:
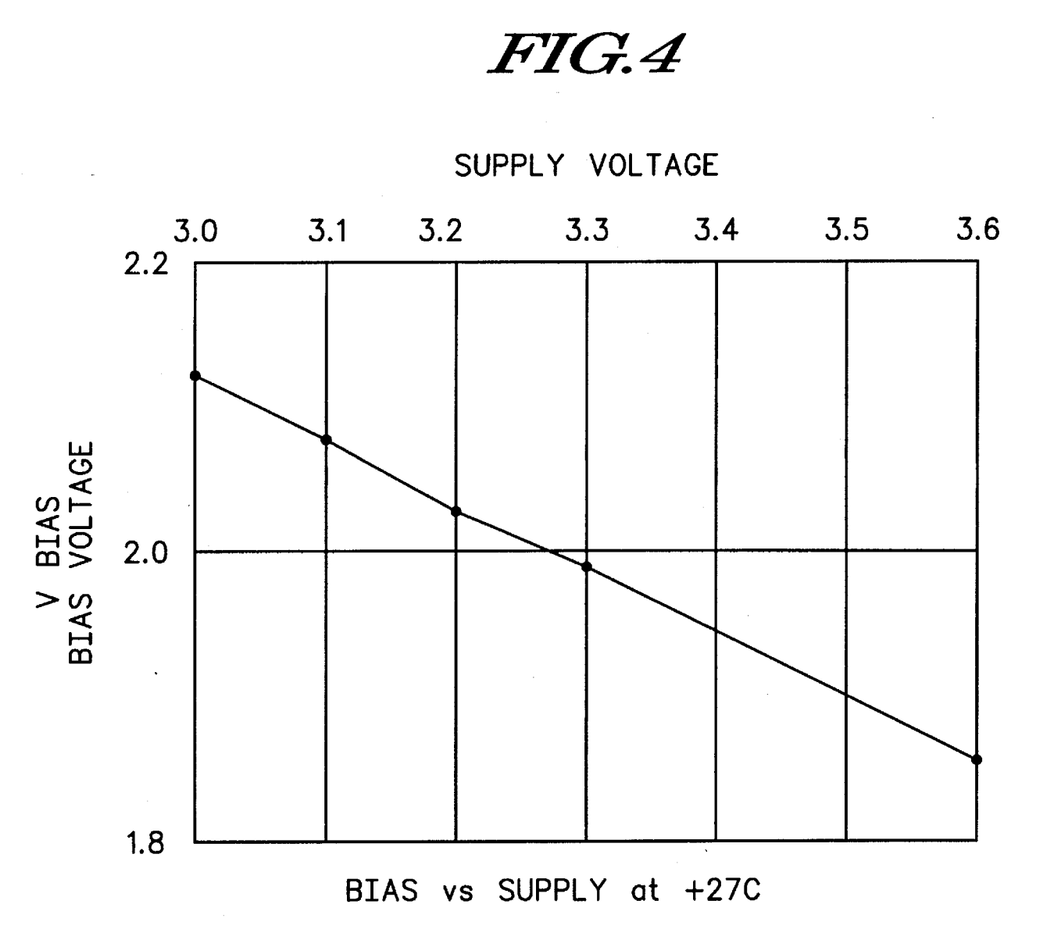
Figure 5:
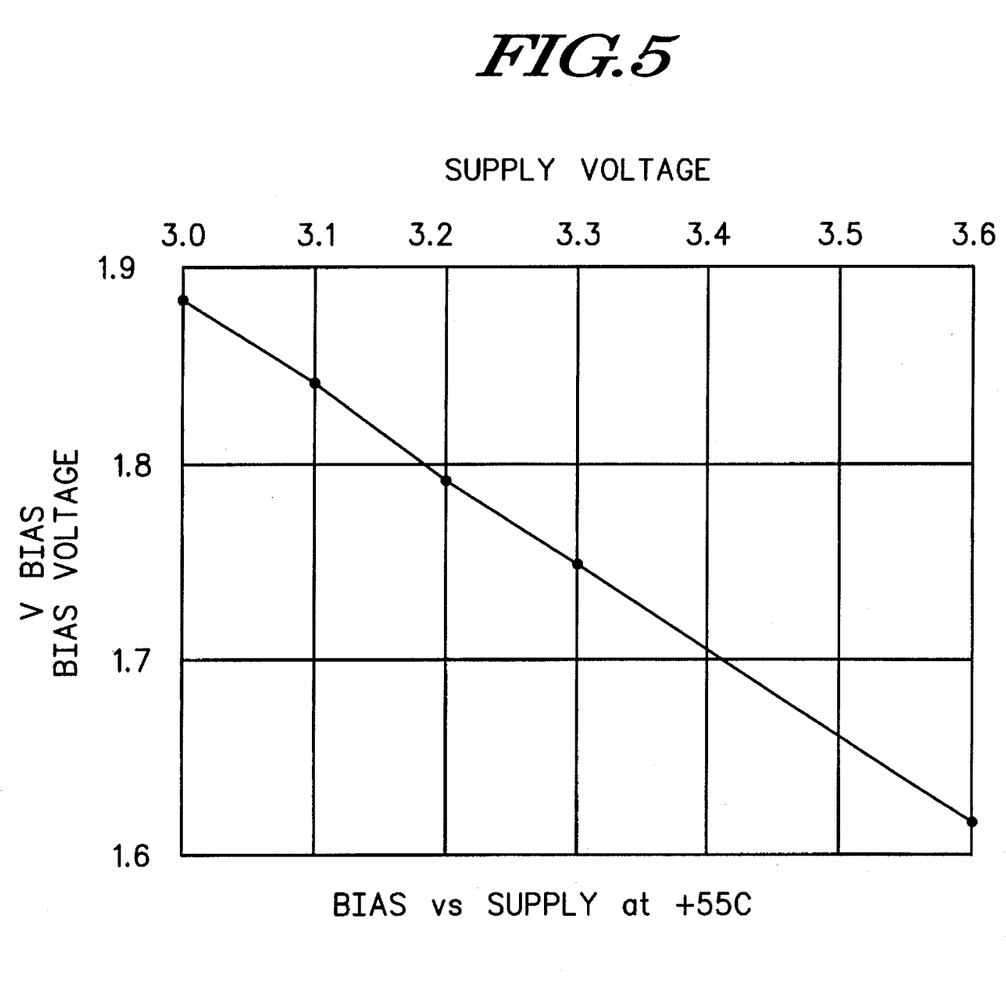

Resistors 202, 204, and 206 together with resistors 214, 216 and 218 determine the slope of the curves in FIGS. 3–5, which controls the amount of voltage compensation which the power amplifier 116 receives. Once nodes A, B, and C are set for the nominal voltage condition, a decrease in the voltage supply 112 will cause a small decrease in the base voltage which is applied to bias transistor 208. This causes the collector-to-emitter resistance of bias transistor to increase, which causes the voltage at node Vbias to increase, thus maintaining a level output power as the power supply 112 drops in voltage. The gain of power amplifier 116 increases with increasing collector voltage and thus the voltage compensating portion of bias circuit 110 again produces the desired effect. For an increase in the voltage at voltage supply 112, a small increase in the base voltage which is applied to bias transistor 208 will occur. This causes the collector-to-emitter resistance of bias transistor to decrease, which causes the voltage at node Vbias to decrease, thus maintaining a level output power as the power supply 112 rises in voltage.

The gain of power amplifier 116 decreases with decreasing collector voltage and again the output power of power amplifier 116 remains constant. The net effect is that the bias voltage level at the bias node Vbias, which is the bias input for the two gain stages of power amplifier 116, adjusts itself to compensate for changes in operating temperature and voltage. Values for resistors 202, 204, 206 and 218 are chosen such that the voltage level at bias voltage (Vbias) node decreases with increasing supply voltage, such that all of the possible 27 permutations of the voltage at points A, B and C produce the desired power adjustment to RF power amplifier 116 at output port 220.

Power amplifier 116 includes an input port for receiving the RF information that is to be transmitted at RF input port 222. RF input 22 is coupled to the voltage-controlled oscillator (VCO) 118 in a typical design. RF amplifier 116 can take the form of other conventional amplifiers as are well known in the art.

In FIGS. 3–5, graphs showing the change in bias voltage at node Vbias provided by active bias circuit 110 versus changes in supply voltage are shown at different operating temperatures. All three graphs show a decreasing bias voltage as the supply voltage increases. The active bias circuit 110 also causes the curves to shift upward as temperature decreases. The net result is substantially level power output by radio frequency amplifier 116 over changes in both temperature and supply voltage.

Figure 6:
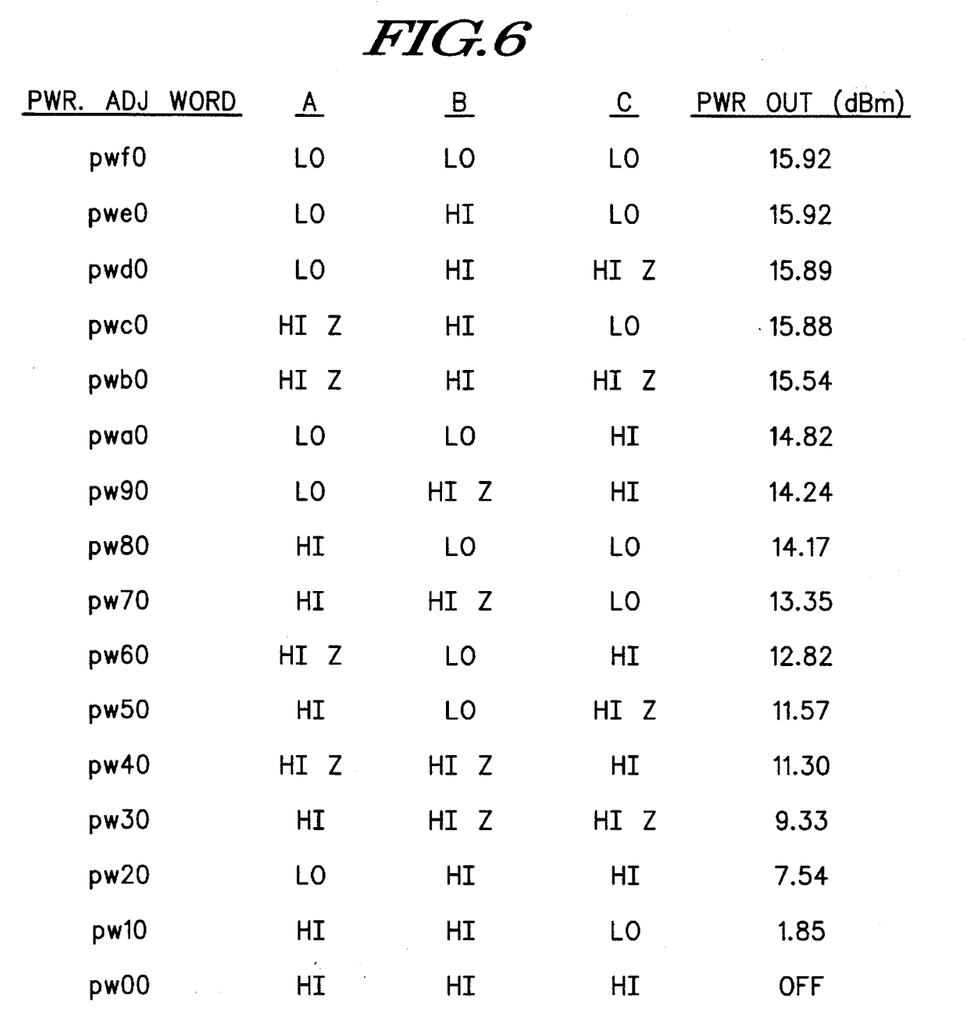
FIG. 6 shows a table of the control words provided by the controller to the active bias circuit and the corresponding changes in power output in accordance with the present invention.

In order to control the power output of the RF power amplifier section 116, controller 108 can provide a power adjust word via control lines 122, 124 and 126. In FIG. 6, a table showing the power output at output 220 for RF power amplifier section 116 in relation to the power adjustment word sent by controller 108 are shown. In the preferred embodiment, nodes A, B and C are chosen independently to be equal to either supply voltage, the voltage level of battery supply 112, in this particular case approximately 3 volts, ground potential or high impedance state generated at the output ports of controller 108. Instead of using a controller 108 as shown to produce the power adjustment words, one can use analog control in which case any desired voltage levels can be applied to nodes A, B and C. More control resistors can be added to the base of bias transistor 208 in order to increase the range of the power adjustment and/or in order to decrease the increment difference between adjacent power levels if using digital power control. In the preferred embodiment, the output power adjustment word is selected in the factory for a particular power output level. However, if one would want to make the meter interface unit 100 more robust, controller 108 could adjust the power word and in turn the power output level based on the current condition of battery 112. For example, if the battery voltage provided by battery 112 were to drop below a predetermined level, the controller 108 could lower the output power level in order to extend the battery life of meter interface unit 100.

If any or all of the control points (A, B and C) are switched between any two states (Vsupply, ground or high impedance), the RF power amplifier 116 becomes amplitude (AM) modulated. The choice of control points and states to be switched determines the modulation level. The frequency of the switching determines the modulation rate or baud rate if performing AM modulation.

Referring to FIG. 6, a table showing a number of power adjustment words sent via control lines 122, 124 and 126 to active bias circuit 110 are shown. Each power adjustment word (pw00–pwf0) sets a different power output level at output port 220. The results shown were taken using a supply voltage of approximately 3.5 volts. With the given resistor values shown in FIG. 2, 16 different power levels were had so only these are shown instead of the full 27 possible power word combinations which can be attained using other resistor value combinations.

The present circuit can also be used to perform amplitude modulation. A typical example of an AM scenario will now be explained. If we take a nominal power setting using power word "pw50" (node A=supply voltage or HI, node B=ground potential or LO, and node C=high impedance or HIZ) we get a power output of 11.57 dBm (decibel 0 dBm=1 milliwatt) at output port 220. If node "C" is toggled between high impedance (HIZ) and ground potential (LO), the power output level will go from 11.57 dBm to 14.17 dBm and back to 11.57 dBm. The frequency at which node "C:" is toggled between HIZ and LO is the modulation frequency. In this example, $$m = \frac{|P1 - P2|}{P\max}$$

where "m" is the modulation index, P1 and P2 are two different power settings from above, and Pmax is the greater of P1 and P2. For the above example, $$m = \frac{|14.35 - 26.17|}{26.17} = .45 \text{ or } 45\% \text{ modulation.}$$

In order to calculate the average total power, $$Pt = P\max \left( 1 + \frac{m^2}{2} \right),$$

in this case, $$\begin{aligned} P_T &= 26.17 \left( 1 + \frac{.45^2}{2} \right) \\ &= 26.17(1.1) \\ &= 28.8 \text{ mW or } 14.59 \text{ dbm} \end{aligned}$$

In summary, the present invention provides for a cost effective active bias circuit for use with low voltage RF power amplifiers. The bias circuit compensates for the effects of temperature and supply voltage variations, while also providing for the adjustment of the output power for an FM amplifier, or adjustment of the output power and modulation of an AM amplifier. All of this is accomplished in the present invention using a minimal amount of parts and can be assembled at a low cost. In applications such as for use in remote meter reading, where operating temperatures changes are frequent and battery supply voltage is constantly changing, the present invention provides for active bias adjustment in order to compensate for these changes in operating conditions.

What is claimed is:

1. An amplifier operational over changing supply voltage and temperature conditions, comprising:

a gain stage having a bias input, for receiving a bias voltage, and a power output level;

an active bias circuit coupled to the gain stage for providing a bias voltage to the gain stage;

the active bias circuit including:

adjustment means for increasing the bias voltage when the temperature decreases and for decreasing the bias voltage when the supply voltage increases; the adjustment means comprising:

a transistor having first, second and control terminals, the first terminal of the transistor is coupled to the bias input of the gain stage and the control terminal is coupled to the first terminal via a first resistor and to the second terminal via a second resistor; and wherein the control terminal of the transistor is coupled to a plurality of resistors coupled to the control terminal of the transistor and a controller, the controller providing voltage levels to the resistors and the plurality of resistors combining the voltage levels to provide a control voltage level at the control terminal of the transistor.

2. An amplifier as defined in claim 1, wherein the controller provides power adjustment information in the form of digital information and the plurality of resistors convert the power adjustment information into an analog voltage level.

3. A radio frequency amplifier operating from a power supply having first and second inputs, the radio frequency amplifier comprising:

a radio frequency gain stage having a bias input and a power output level;

an active bias circuit coupled to the radio frequency gain stage;

the active bias circuit including:

a first resistor coupled in series between the bias input of the radio frequency gain stage and the first output of the power supply;

a transistor having first, second and control terminals, the first terminal of the transistor is coupled to the bias input of the radio frequency gain stage and the control terminal is coupled to the first terminal via a second resistor and to the second terminal via a third resistor;

a controller having an output port for providing a control signal to adjust the power output level; and at least one control resistor coupled between the control terminal of the transistor and the output port of the controller for receiving the control signal.

4. A radio frequency amplifier as defined in claim 3, wherein the active bias circuit in response to the control signal adjusts the gain of the radio frequency gain stage, thereby adjusting the power output level.

5. A radio frequency amplifier as defined in claim 6, wherein the control signal provided by the controller can be at a first or second state; and the controller can amplitude modulate the radio frequency gain stage by switching between the first and second states.

6. An amplifier receiving a supply voltage, comprising:

an adjustable gain amplifier having an output port for providing an output signal having a power output level, and an input port for receiving a bias signal;

a bias circuit having a transistor having first, second and control terminals, the bias circuit providing a bias signal to the radio frequency power amplifier;

a controller having a port, a plurality of resistors disposed between the control terminal of the transistor and the port, the controller adjusting the power output level of the amplifier to a selected level by providing a digital word to the port, the digital word being converted to an analog level by the plurality of resisters; and wherein the transistor maintains the selected power output level constant by adjusting the bias signal in response to changes in the level of the supply voltage by adjusting the resistance between the transistor's first and second terminals.

7. An amplifier as defined in claim 6, wherein the bias signal comprises a voltage level.

8. An amplifier as defined in claim 6, wherein the transistor is in thermal proximity to the adjustable gain amplifier such that the resistance between the first and second terminals of the transistor changes with changes in the operating temperature of the adjustable gain amplifer causing the output signal provided by the adjustable gain amplifier to remain substantially level over changes in operating temperture.

\* \* \* \* \*

UNITED STATES PATENT AND TRADEMARK OFFICE
CERTIFICATE OF CORRECTION

PATENT NO. : 5,570,065
DATED : October 29, 1996
INVENTOR(S) : Eberhardt, et al.

It is certified that error appears in the above-identified patent and that said Letters Patent is hereby corrected as shown below:

Column 6, line 50 reads "resisters" should be --resistors--.

Signed and Sealed this

Twenty-sixth Day of September, 2000

Attest:

Q. TODD DICKINSON

*Attesting Officer*          *Director of Patents and Trademarks*